(12) United States Patent
Warr et al.

(10) Patent No.: US 9,257,922 B2
(45) Date of Patent: Feb. 9, 2016

(54) PARALLEL HARNESS CURRENT IMBALANCE AND FAILURE DETECTION

(71) Applicant: HONEYWELL INTERNATIONAL, INC., Morristown, NJ (US)

(72) Inventors: William Warr, Glendale, CA (US); Evgeni Ganev, Torrance, CA (US); Chiyuan Chiang, Granada Hills, CA (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 13/841,084

(22) Filed: Mar. 15, 2013

(65) Prior Publication Data

US 2014/0346986 A1     Nov. 27, 2014

(51) Int. Cl.
*H02P 6/12*        (2006.01)
*H02J 3/06*        (2006.01)
*H02J 4/00*        (2006.01)
*G01R 29/16*    (2006.01)

(52) U.S. Cl.
CPC ......... *H02P 6/12* (2013.01); *G01R 29/16* (2013.01); *H02J 3/06* (2013.01); *H02J 4/00* (2013.01)

(58) Field of Classification Search
CPC .................................. H02P 6/12; G01R 29/16
USPC .......... 318/400.21, 400.29, 400.31, 806, 599, 318/432; 324/764.01; 363/132
See application file for complete search history.

(56) References Cited

U.S. PATENT DOCUMENTS

| | | |
|---|---|---|
| 7,271,557 B2 | 9/2007 | Ajima et al. |
| 7,710,082 B2 | 5/2010 | Escobar Valderrama et al. |
| 2009/0140745 A1* | 6/2009 | Williams ........... G01R 31/2829 324/522 |
| 2010/0293473 A1* | 11/2010 | Borst ................... H04L 12/1827 715/741 |
| 2012/0001574 A1 | 1/2012 | Akaishi et al. |
| 2012/0329557 A1* | 12/2012 | Takamura ............... A63F 13/12 463/31 |

FOREIGN PATENT DOCUMENTS

| | | |
|---|---|---|
| JP | 2010110067 A | 5/2010 |
| WO | 2011135652 A1 | 11/2011 |

OTHER PUBLICATIONS

Escobar, G.; "Div. of Appl. Math, Res. Institute of Science & Technology of San Luis Potosi"; Industrial Electronics, IEEE Transactions, vol. 54, Issue 2; Apr. 2007.

* cited by examiner

*Primary Examiner* — Shawki S Ismail
*Assistant Examiner* — Muhammad S Islam
(74) *Attorney, Agent, or Firm* — Shimokaji IP

(57) ABSTRACT

Current imbalance may be detected in a 3-phase power system by monitoring current output between two points of a phase signal provided along wire pairs from an inverter to a motor. In some embodiments, each wire of a wire pair leading to the motor from the inverter may be provided with a line current sensor. A comparison of current output from each wire in the wire pair may be performed to determine if a current imbalance is present. In some embodiments, a phase current sensor may be coupled to a phase input of the inverter. Failures in the 3-phase system may be detected by measuring the output from each phase current sensor for imbalanced distribution of power output. In some embodiments, the output from the phase current sensors may be compared to an output of a line current sensor along the same phase for current imbalances or harness failures.

11 Claims, 5 Drawing Sheets

PARALLEL HARNESS CURRENT IMBALANCE AND FAILURE DETECTION

BACKGROUND OF THE INVENTION

The present invention generally relates to power detection systems and more particularly to parallel harness current imbalance and failure detection.

High-power electronics play a significant role in the modern aircraft and automotive industry. This is particularly true in the area of traction drive applications for aircraft and ground vehicles. The commercial aircraft business is moving toward more fuel efficient and environmental friendly traction drive operations. One example from this latest trend is the electrical taxi application for the Airbus A320 NEO airplane. In the Airbus A320 NEO, the airplane will be using an auxiliary power unit (APU) to power the electric drive system to taxi into and/or out from a runway. All or part of the airplane's engines will be turned off during taxiing to save fuel. The electric drive system contains an autotransformer rectifier unit (ATRU), a motor controller/inverter, a gearbox, and a traction motor. The benefits of an electrical taxi system include reduction of fuel consumption, brake wear, and ground tug operation.

Military ground vehicles have migrated toward hybrid electric technology where some vehicles employ main propulsion from electric drives. Substantial demand for power utilization increases when using more electric technology to propel the vehicle. Thus, a significant increased usage in high-power harnesses for the electric drive system results from the demand for more power. In some applications, a set of 3-phase high-power harnesses may be used to bring 3-phase 115-VAC at 400 Hz from the APU to the ATRU to generate a high-voltage DC source for the motor controller/inverter. A power distribution harness may be used to deliver a high-voltage DC source from the ATRU to the motor controller/Inverter. A set of 3-phase cables may connect the motor controller/inverter outputs to drive the traction motor with AC voltage/current generated from the motor controller. The harness may carry the high load current that is necessary to deliver high torque (such as breakaway torque) and acceleration for vehicles/airplanes to reach a desired taxi speed.

In conventional power systems for taxi systems, for example hydraulic brakes, 1 kilowatt was adequate to power the system. Thus smaller radius wires are sufficient for routing in the system. However, for the increased power requirements of the power aforementioned distribution harnesses, routing constraints of the vehicle as well as the current carrying capacity may require thicker wiring. For example, some electric applications may use 50-kW-60 kW to the taxi system fed from the fuselage. Due to additional environmental and space constraints (such as routing and bending of cables for retrofitting an existing system), there may be a need to parallel the harness with smaller wires to meet the power and current rating of the system. The parallelization creates new challenges. The paralleled wires may be difficult to impedance match and result in imbalanced currents to circulate in the taxi system that may create power losses and heat.

As can be seen, there is a need for detection that monitors for imbalanced current in 3-phase power systems in vehicles.

SUMMARY OF THE INVENTION

In one aspect of the present invention, a current imbalance detection system comprises an inverter; a motor; a plurality of current sensors connected to wires that are configured to carry 3-phase current from the inverter to the motor; a processor coupled with the motor; and memory coupled to the processor, including instructions, which when executed by the processor, compare measurements of at least two of the plurality of current sensors and determine whether a current imbalance is present in the 3-phase power system.

In another aspect of the present invention, a current imbalance detection system comprises an inverter; a motor; a plurality of wires configured to carry 3-phase electrical current from the inverter to the motor; at least one line current sensor connected to one of the plurality of wires; at least one phase current sensor connected to one phase input of the inverter; a processor coupled with the motor; and memory including instructions, which when executed by the processor compare measurements of the line current sensor to the phase current sensor and determine if a current imbalance is present in the 3-phase power system based on the comparison.

In still another aspect of the present invention, a method of detecting current imbalance comprises measuring output current from at least two terminals of wiring from a phase input of a 3-phase power system; comparing the measured output current of a first of the two terminals of the wire to the output current of a second of the two terminals of the wire; and determining whether a current imbalance in the 3-phase power system is present based on the comparison.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide systems and methods that monitor current in 3-phase power systems. In some embodiments, the 3-phase system is used for example in a high-power/high-current electric drive system for a traction drive in the aerospace and automotive industries. A high-power electric drive system according to the present invention may use high current (e.g. 200 amp) carrying capacity cables to deliver torque and mechanical power to a load. The electrical drive may be equipped with an inverter for robust and high reliability operation. In some embodiments, there may be a set of three wires carrying 3-phase (one wire per phase) AC current signals to an AC motor to drive a mechanical load. In some embodiments, two wires may be run in parallel per phase (for example, in 3-phase systems) to high-frequency, high-power electric AC machines. It may be appreciated that using parallel feeders may overcome wire constraints, for example "sharp" bend radii for routing, connector pin size limitations (by current handling capability or connector availability), or a requirement to reduce functional operation for emergency equipment operation.

In embodiments, where parallel feeders (more than two wires per phase) are used, there is no assurance that the electrical impedance of the parallelized wires is perfectly matched. Generally, the paralleled set of feeders may be built with the same length and the DC resistances may be nearly equal; however, line AC impedance may be affected by the wire routing. As the AC frequency is increased, the effect on line AC impedance may be multiplied. Thus, the electric current may not be equally shared between the wires. In some embodiments, current monitoring is provided to determine the level of feeder current imbalance present in the drive system to prevent the possibility of catastrophic failure. The amount of paralleled feeder imbalance to an AC machine driven by a single inverter may be monitored to detect current. Embodiments may detect feeder failure (for example, open circuits, short circuits, and ground faults) in high-power systems that use parallel wires.

Figure 1:
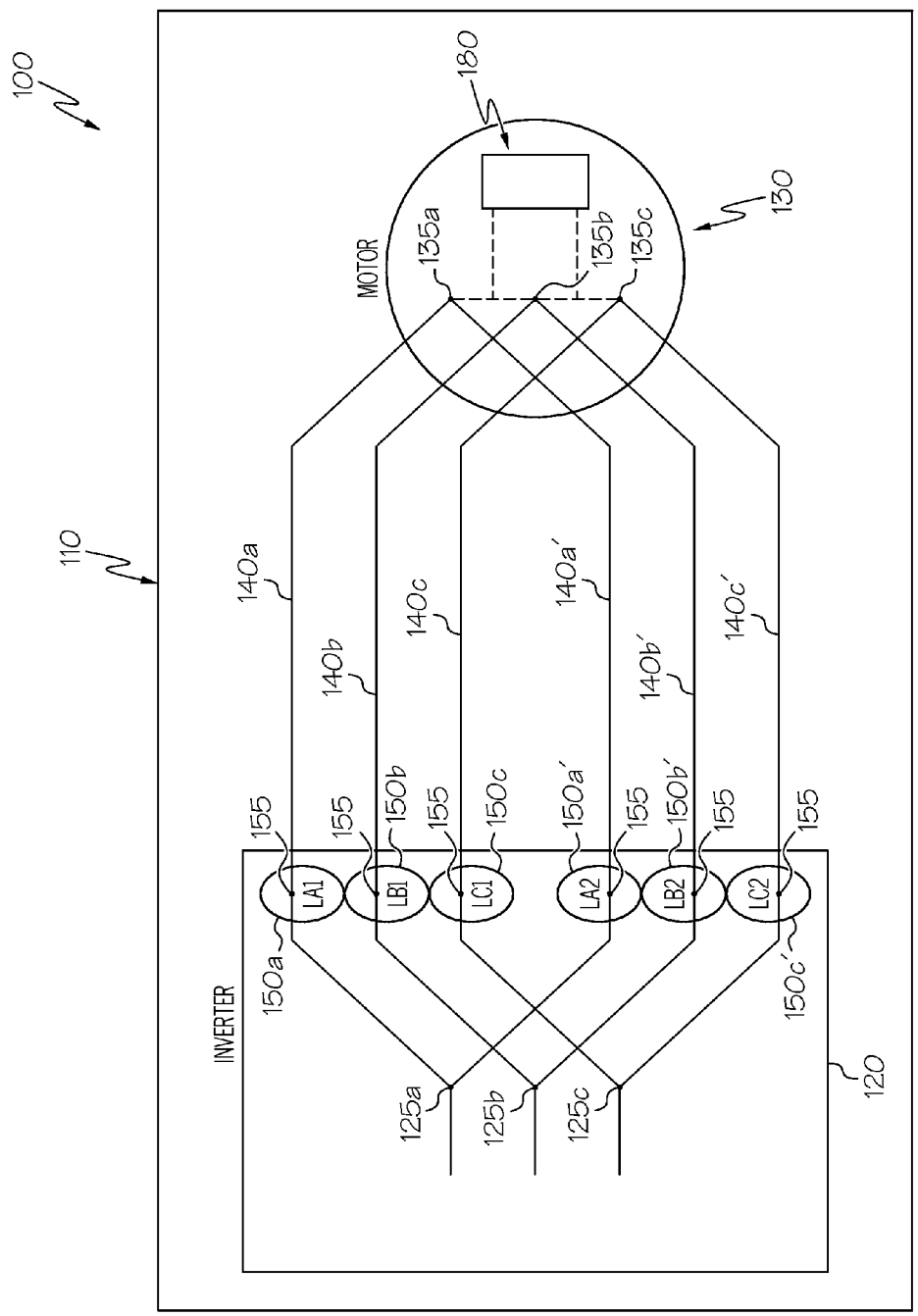
FIG. 1 is a block diagram of a current imbalance detection system in accordance with an exemplary embodiment of the present invention.
Figure 5:
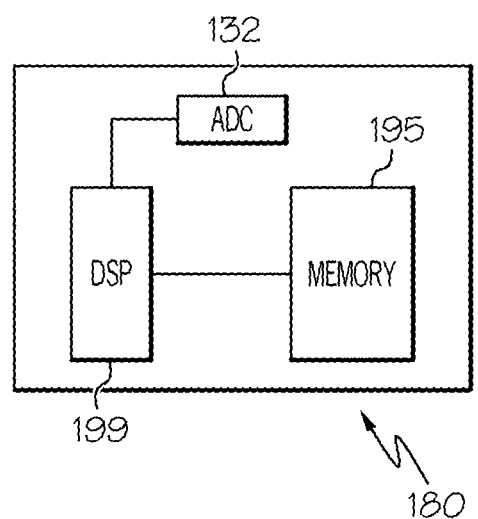
FIG. 5 is a block diagram of an exemplary controller used in the current imbalance detection systems of FIGS. 1, 2, and 3.

Referring to FIGS. 1 and 5, a current imbalance detection system 100 is shown according to an exemplary embodiment of the present invention. FIG. 5 shows a controller 180 according to an exemplary embodiment of the present invention. In some embodiments, the current imbalance detection system 100 may be integral to a 3-phase power system 110 to detect failures in the 3-phase power system 110. The 3-phase power system 110 may include an inverter 120 providing 3-phase power to a motor 130. In some embodiments, the inverter 120 may be a 3-phase inverter. The output of the inverter 120 may be delivered using two wires (referred to in general as wires 140) per phase to carry load current to the motor inputs 135. The current may be delivered along parallel wires 140. For example, a first phase may be provided (via phase 1 input 125a) on wires 140a and 140a' to motor input 135a. A second phase may be provided (via phase 2 input 125b) on wires 140b and 140b' to motor input 135b. A third phase may be provided (via phase 3 input 125c) on wires 140c and 140c' to motor input 135c.

In an exemplary embodiment, the current imbalance detection system 100 may include a current sensor 150 installed at a terminal 155 on each wire 140 to monitor the current conditions in the 3-phase power system 110. It will be understood that the position of the line current sensors 150 may be between the inverter 120 and the motor 130 and their position in the drawings is only for sake of illustration. A controller 180 may be connected to the motor 130 to detect current imbalance and identify sources of failure in the 3-phase power system 110. The controller 180 may include a high-performance digital signal processor (DSP) 199. The DSP 199 may be connected to memory 195 in which instructions are stored that are executed by the DSP 199. The description herein describes the DSP 199 performing functions; however, those functions may be stored in the memory 195 as instructions and executed by the DSP 199. The DSP 199 may implement an imbalanced current and harness failure detection algorithm and may execute motor control algorithms based on the results of the algorithm. For example, the DSP 199 may sum measured line currents for paired wires (e.g. wires 140a and 140a') to obtain phase current information for current loop control.

The measured line currents may be obtained from current sensors 150 for each wire pair (140a and 140a'; 140b and 140b'; 140c and 140c'). For example, the measured current on current sensors 150a and 150a' may be summed to provide the current for wired pair 140a and 140a'. The measured current on current sensors 150b and 150b' may be summed to provide the current for wired pair 140b and 140b'. The measured current on current sensors 150c and 150c' may be summed to provide the current for wired pair 140c and 140c'. Each current sensor 150 may be compared (by the DSP 199) to the other current sensor 150 in the same phase to detect cable failure (e.g. current imbalance, short circuit, or ground fault). For example, if the current sensor 150a reading is zero and the current sensor 150a' reading measures full phase current, a line feeder open failure may be present. In some embodiments, current sensor 150 output may be sampled using an ADC (analog digital converter) 132 (FIG. 5). It may be appreciated that the current on each feeder wire 140 may be measured directly. Thus, the current sensing device rating may be smaller than the full amount of rated phase current, which could result in needing a minimal number of current sensors 150 which may result in a smaller and lighter system 100.

Figure 2:
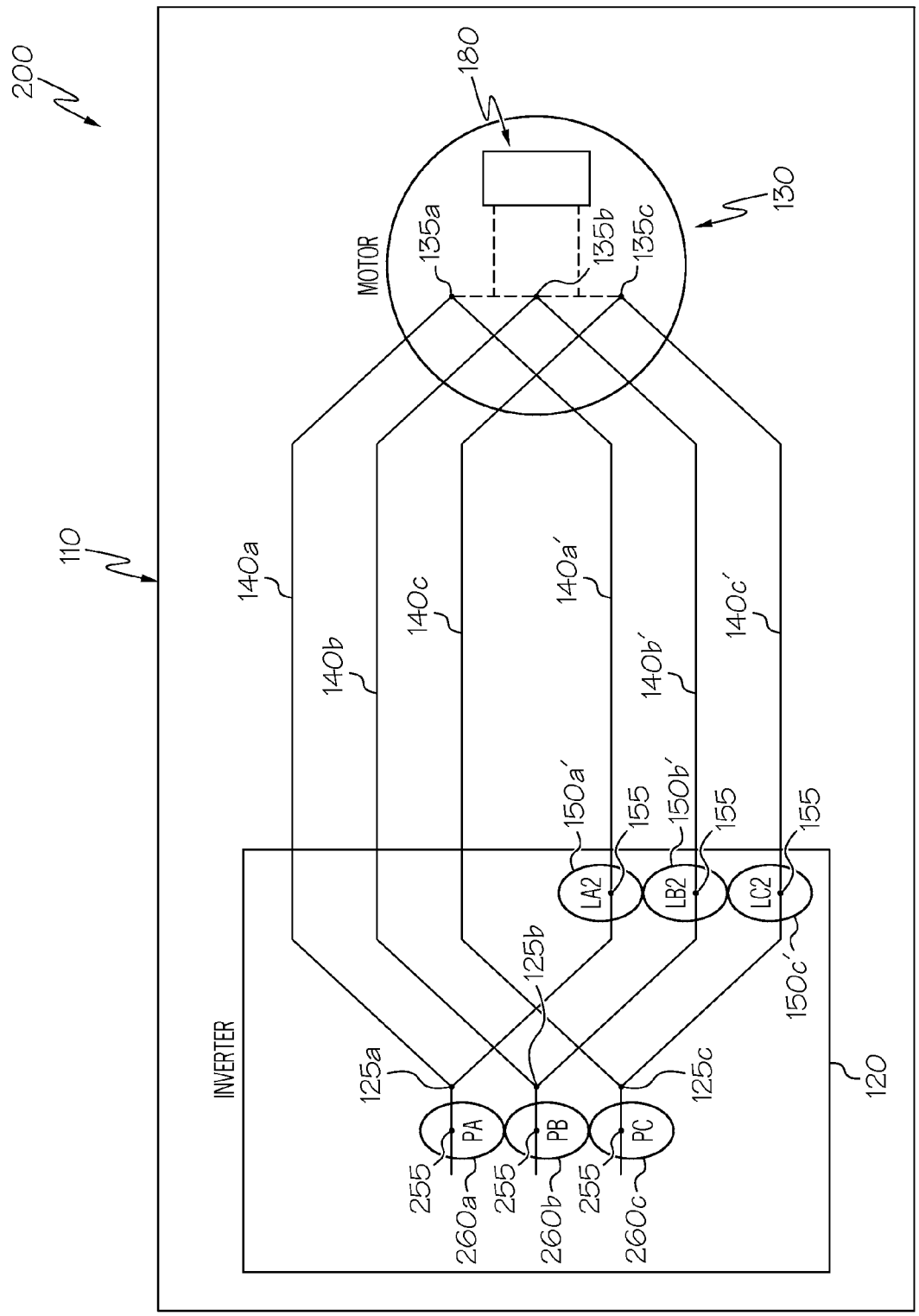
FIG. 2 is a block diagram of a current imbalance detection system in accordance with another exemplary embodiment of the present invention.

Referring now to FIG. 2, a current imbalance detection system 200 in the vehicle 110 is shown according to an exemplary embodiment of the present invention. The system 200 is similar to the system 100 except that 3-phase current sensors (260a, 260b and 260c) may be positioned before the phase inputs 125a, 125b, and 125c respectively and the line current sensors 150a, 150b, and 150c may be omitted. The 3-phase current sensors (260a, 260b and 260c) may provide phase current information directly to the DSP 199 for current loop control. Phase current measurements may be taken at terminals 255 which may be before the phase inputs 125. The three line current sensors (150a', 150b', and 150c') may provide the additional current measurements needed for detecting current imbalance and harness faults. For example, the DSP 199 may compare to the phase current sensor 260 and line current sensor 150 for each phase input 125. Since the phase current sensor 260 should represent the total current for each phase input 125, the DSP 199 may check if the phase current sensor 260 current measurement is consistent with a predetermined ratio of current output for the phase current sensor 260 and the line current sensor 150. For example, the phase current sensor 260 should measure approximately twice the current as the corresponding line current sensor 150 in the same phase. Discrepancies in the comparison between the phase current sensor 260 and its corresponding line current sensor 150 may indicate a current imbalance or harness failure. It may be appreciated that the phase current may be measured with the phase current sensors 260 directly. Thus, summing up multiple sensor measurements may be avoided and an ADC 132 (FIG. 5) may not be necessary. In addition, the system 200 may allow for different rating devices between line current sensors 150 and phase current sensors 260 to be used in the same phase.

Figure 3:
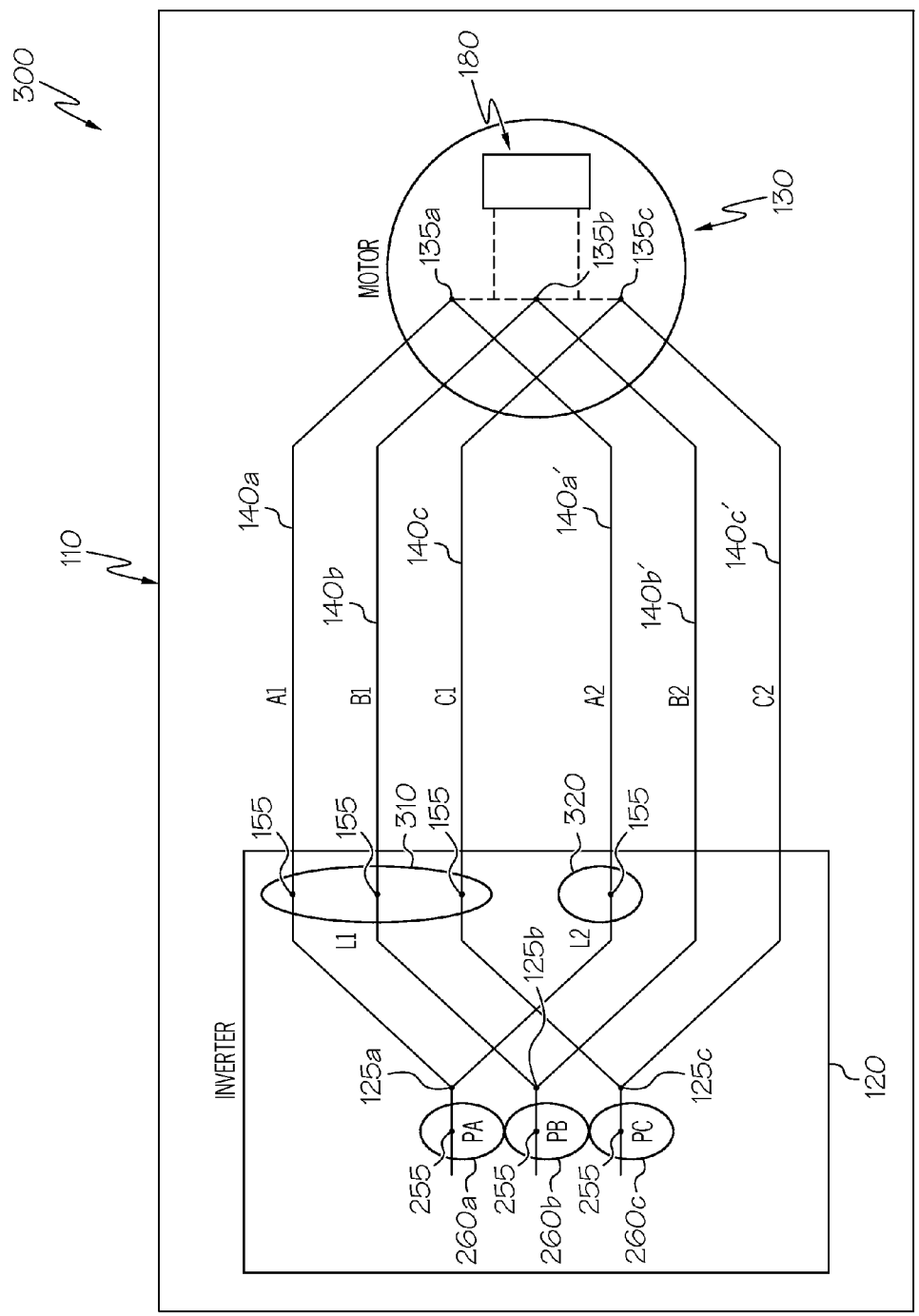
FIG. 3 is a block diagram of a current imbalance detection system in accordance with yet another exemplary embodiment of the present invention.

Referring now to FIG. 3, a current imbalance detection system 300 in the vehicle is shown according to an exemplary embodiment of the present invention. The system 300 is similar to system 200 except that, only five current sensors may necessarily be used where line current sensors 150 may be omitted for line current sensors 310 and 320. Similar to system 200, in system 300, the measurements of the phase current sensors 260a, 260b may provide phase current information directly to the DSP 199, used for current loop control as well as failure detection. The two line current sensors 310 and 320 may be used to detect current imbalance and harness failure detection.

In an exemplary embodiment, the line current sensor 310 may be connected to each phase, for example the wires 140a, 140b, and 140c simultaneously. The line current sensor 310 may be used to detect any imbalanced current among the three phases. In an exemplary embodiment, the output of line current sensor 310 may be expected to be approximately zero when power is being distributed evenly among the three phases.

In an exemplary embodiment, the line current sensor 320 may be connected to any of the wires 140a', 140b', or 140c'. The line current sensor 320 may be used to detect some failure cases that are not detectable by the line current sensor 310 and the three phase current sensors 260. For example, failure or imbalance within a pair of wires (for example, 140a and 140a') may be detected if the DSP 199 detects that the current value of line current sensor 150a' is not approximately half that of the current value of phase current sensor 260a.

By using five current sensors (260a, 260b, 260c, 310, and 320), the system 300 may sense the detectable failures detected using 6 current sensors in system 100 and system 200 respectively. Thus less hardware resources may be needed and less weight in the system 300 may be achieved. In addition, a lower current rating for the system 300 may be achieved. An exemplary list of detectable failure conditions in system 300, the failure scenario and which current sensors detected the failure conditions is shown in Table 1 below.

TABLE 1

| Failure Scenario | Detected By | Detected Condition |
|---|---|---|
| A1 Open | L1 and L2 | L1 ≠ 0 and L2 = PA1 |
| B1 Open | L1 | L1 ≠ 0 |
| C1 Open | L1 | L1 ≠ 0 |
| A2 Open | L1 and L2 | L1 ≠ 0 and L = 0 |
| B2 Open | L1 | L1 ≠ 0 |
| C2 Open | L1 | L1 ≠ 0 |
| A1 Shorted to GND | L1 and PA | L1 ≠ 0, PA >> 0 |
| B1 Shorted to GND | L1 and PB | L1 ≠ 0, PB >> 0 |
| C1 Shorted to GND | L1 and PC | L1 ≠ 0, PC >> 0 |
| A2 Shorted to GND | L1 and L2 and PA | L1 ≠ 0, PA >> 0, L2 >> 0 |
| B2 Shorted to GND | L1 and PB | L1 ≠ 0, PB >> 0 |
| C2 Shorted to GND | L1 and PC | L1 ≠ 0, PC >> 0 |
| A1 B1 C1 Shorted to GND | L2 and PA, PB, PC | PA >> 0, PB >> 0, PC >> 0, L2 = 0 |
| A2 B2 C2 Shorted to GND | L2 | L1 = 0, PA >> 0, PB >> 0, PC >> 0, L2 >> 0 |
| A1 B1 C1 Open | L2 | L1 = 0, L2 = PA |
| A2 B2 C2 Open | L2 | L1 = 0, PA ≠ 0, PB ≠ 0, PC ≠ 0, L2 = 0 |
| Any two lines Open | L1 | L1 ≠ 0, L2 values depend on which two open |

Figure 4:
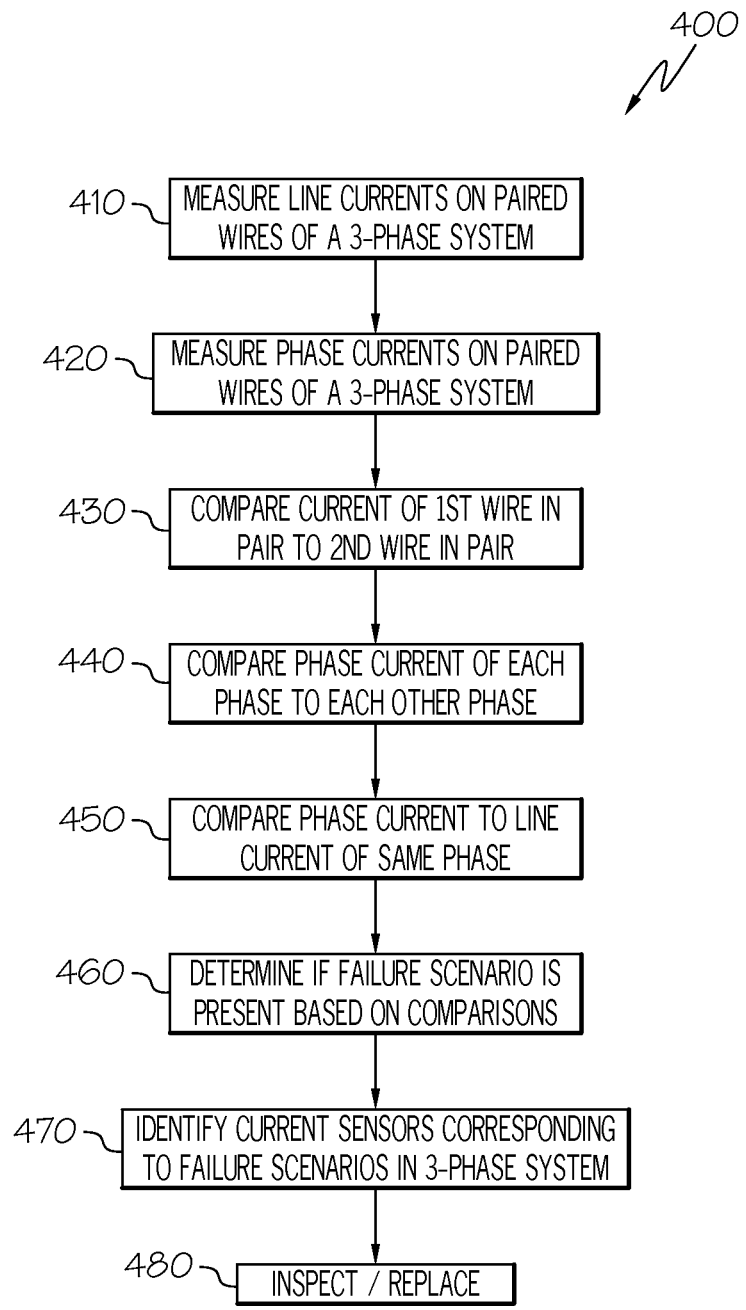
FIG. 4 is a block diagram illustrating a method of detecting a current imbalance or harness failure in accordance with yet another exemplary embodiment of the present invention.

Referring to FIG. 4, a method 400 of detecting current imbalance or harness failure in a 3-phase system is shown according to an exemplary embodiment of the present invention. In FIG. 4, the blocks in may be stored in memory 195 as instructions and executed by the DSP 199. The DSP 199 may (in block 410) measure, via line current sensors 150, line currents on terminals 155 of paired wires 140 in a 3-phase system (for example, systems 100, 200, or 300). The DSP 199 may measure (in block 420), via phase current sensors 260, phase currents in the paired wires 140 of the 3-phase system 100, 200, or 300. The DSP 199 may compare (in block 430), the line current of a first wire 140 (e.g. 140a) to the current of a second wire 140 (e.g. 140a') in the same phase. The DSP 199 may compare (in block 440) the measured phase current of each phase to each other phase. The DSP 199 may compare (in block 450) the measured phase current of a phase to the measured line current(s) of the same phase. The DSP 199 may determine (in block 460) if a failure scenario is present in the 3-phase system 100, 200, or 300 based on the comparisons of blocks 430, 440, 450. The DSP 199 may reference for example Table 1 and compare the results of the comparisons from blocks 430, 440, and 450 to a list of detected conditions and failure scenarios in making the determination of block 460. The DSP 199 may identify (in block 470) the source of the error, for example, which current sensors 150, 260 correspond to the determined failure scenario of block 460. In one implementation, the DSP 199 may identify the source of the error by providing an indication to a display device (not shown) that indicates the source of the the current imbalance to a technician. Upon identifying the source of current imbalance, a technician may inspect (in block 480) the system 110 for the source of imbalance. For example, if a short or open circuit is detected along one of the wires, the technician may check the wiring for damage.

It should be understood, of course, that the foregoing relates to exemplary embodiments of the invention and that modifications may be made without departing from the spirit and scope of the invention as set forth in the following claims.

We claim:

1. A current imbalance detection system in a 3-phase power system, comprising:
   an inverter;
   a motor;
   a plurality of current sensors connected to wires that are configured to carry 3-phase current from the inverter to the motor;
   a processor coupled with the motor; and
   memory coupled to the processor, including instructions, which when executed by the processor, compare measurements of at least two of the plurality of current sensors and determine whether a current imbalance is present in the 3-phase power system,
   wherein the wires include a plurality of wire pairs and each wire pair of the plurality of wire pairs electrically connect a phase input of the inverter to the motor; and
   wherein the plurality of current sensors include a line current sensor on at least one wire of each wire pair.

2. The current imbalance detection system of claim 1, wherein the plurality of current sensors includes line current sensors configured to measure the current on the wires.

3. The current imbalance detection system of claim 1, wherein each wire of each wire pair includes one of the line current sensors.

4. The current imbalance detection system of claim 1, wherein the memory further includes instructions, which when executed by the processor, in response to determining that the current imbalance is present, identifies one of the two current sensors corresponding to a source of the current imbalance.

5. The current imbalance detection system of claim 3, wherein the memory further includes instructions, which when executed by the processor:
   compare a current output of a first wire in the wire pair to a current output of a second wire in the wire pair, and
   detect a current imbalance in the 3-phase power system based on the comparison of the first current output to the second current output.

6. A current imbalance detection system in a 3-phase power system, comprising:
- an inverter;
- a motor;
- a plurality of wires configured to carry 3-phase electrical current from the inverter to the motor;
- at least one line current sensor connected to one of the plurality of wires;
- at least one phase current sensor connected to one phase output of the inverter;
- a processor coupled with the motor; and
- memory coupled to the processor, including instructions, which when executed by the processor compare measurements of the line current sensor to the phase current sensor and determine if a current imbalance is present in the 3-phase power system based on the comparison,
- wherein the wire connected to the at least one line current sensor is connected to the same phase input as the phase current sensor.

7. The current imbalance detection system of claim 6, wherein the memory includes instructions, which when executed by the processor, detect current imbalance in the 3-phase power system based on a predetermined ratio of current measured by the line current sensor to current measured by the phase current sensor.

8. A method of detecting current imbalance, comprises:
- measuring output current from at least two terminals of wiring from a phase input of a 3-phase power system;
- comparing the measured output current of a first of the two terminals of the wire to the output current of a second of the two terminals of the wire; and
- determining whether a current imbalance in the 3-phase power system is present based on the comparison,
- wherein the first of the two terminals is coupled to a line current sensor and the second of the two terminals is coupled to a phase current sensor.

9. The method of claim 8, wherein the determination is based on a predetermined ratio of output current of the phase current sensor to the line current sensor.

10. The method of claim 8, wherein the two are on separate wires of a wire pair and the first measured output is from a first line current sensor of a first wire of the wire pair and the second measured output current is from a second line current sensor on a second wire of the wire pair.

11. The method of claim 8, wherein in response to determining that the current imbalance is present, identifying one of the two terminals corresponding to a source of the current imbalance.

* * * * *